(12) United States Patent
Abou-Kandil et al.

(10) Patent No.: US 9,105,805 B2
(45) Date of Patent: Aug. 11, 2015

(54) ENHANCING EFFICIENCY IN SOLAR CELLS BY ADJUSTING DEPOSITION POWER

(71) Applicant: INTERNATIONAL BUSINESS MACHINES CORPORATION, Armonk, NY (US)

(72) Inventors: Ahmed Abou-Kandil, Elmsford, NY (US); Augustin J. Hong, White Plains, NY (US); Jeehwan Kim, White Plains, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/146,138

(22) Filed: Jan. 2, 2014

(65) Prior Publication Data
US 2014/0120655 A1    May 1, 2014

Related U.S. Application Data

(63) Continuation of application No. 13/406,970, filed on Feb. 28, 2012, now abandoned.

(51) Int. Cl.
| | |
|---|---|
| *H01L 31/18* | (2006.01) |
| *H01L 31/20* | (2006.01) |
| *H01L 31/0216* | (2014.01) |
| *H01L 31/075* | (2012.01) |
| *C23C 16/22* | (2006.01) |

(52) U.S. Cl.
CPC ............ *H01L 31/1884* (2013.01); *C23C 16/22* (2013.01); *H01L 31/02167* (2013.01); *H01L 31/075* (2013.01); *H01L 31/204* (2013.01); *Y02E 10/548* (2013.01)

(58) Field of Classification Search
CPC . H01L 31/1884; H01L 31/204; H01L 31/075; H01L 31/02167; Y02E 10/548
USPC .................. 438/57, 87, 96; 136/255, 261; 257/E31.119
See application file for complete search history.

(56) References Cited

U.S. PATENT DOCUMENTS

| | | | | |
|---|---|---|---|---|
| 4,396,793 | A  * | 8/1983 | Madan | 136/255 |
| 6,037,614 | A  * | 3/2000 | He et al. | 257/184 |
| 6,242,686 | B1 | 6/2001 | Kishimoto et al. | |
| 6,537,370 | B1 * | 3/2003 | Hernandez et al. | 117/88 |
| 7,276,749 | B2 * | 10/2007 | Martin et al. | 257/292 |
| 8,455,292 | B2 * | 6/2013 | Assefa et al. | 438/69 |

(Continued)

FOREIGN PATENT DOCUMENTS

| | | | | |
|---|---|---|---|---|
| KR | 10-0957679 | * | 5/2010 | H01L 31/042 |
| KR | 957679 | * | 5/2010 | H01L 31/042 |

OTHER PUBLICATIONS

Translation of KR 10-0957679.*
Bouizem et al., "Optoelectronic properties of hydrogenated amorphous germanium deposited by rf-PECVD as a function of applied rf-power", J. Phys.: Condens. Matter, vol. 17 (2005), pp. 5149-5158.*

(Continued)

*Primary Examiner* — Mary Wilczewski
(74) *Attorney, Agent, or Firm* — Tutunjian & Bitetto, P.C.; Louis J. Percello (57) ABSTRACT

Methods for forming a photovoltaic device include adjusting a deposition power for depositing a buffer layer including germanium on a transparent electrode. The deposition power is configured to improve device efficiency. A p-type layer is formed on the buffer layer. An intrinsic layer and an n-type layer are formed over the p-type layer.

16 Claims, 5 Drawing Sheets

(56) References Cited

U.S. PATENT DOCUMENTS

| | | | |
|---|---|---|---|
| 2007/0231488 A1* | 10/2007 | Von Kaenel | 427/255.15 |
| 2007/0235074 A1* | 10/2007 | Henley et al. | 136/252 |
| 2007/0272297 A1 | 11/2007 | Krivoshlykov et al. | |
| 2008/0105299 A1 | 5/2008 | Krasnov | |
| 2009/0133753 A1 | 5/2009 | Sasaki et al. | |
| 2010/0307574 A1 | 12/2010 | Matsumoto et al. | |
| 2011/0088760 A1 | 4/2011 | Sheng et al. | |
| 2011/0126893 A1 | 6/2011 | Myong | |
| 2011/0232754 A1 | 9/2011 | Myong | |
| 2011/0272010 A1 | 11/2011 | Abou-Kandil et al. | |
| 2011/0315992 A1* | 12/2011 | Nguyen et al. | 257/66 |
| 2012/0055534 A1 | 3/2012 | Leschkies et al. | |
| 2012/0152352 A1* | 6/2012 | Chen et al. | 136/261 |
| 2013/0065349 A1* | 3/2013 | Assefa et al. | 438/69 |
| 2013/0221464 A1* | 8/2013 | Fogel et al. | 257/432 |
| 2013/0224899 A1* | 8/2013 | Abou-Kandil et al. | 438/72 |
| 2013/0298971 A1* | 11/2013 | Chen et al. | 136/252 |
| 2014/0106150 A1* | 4/2014 | Decker et al. | 428/216 |
| 2014/0120655 A1* | 5/2014 | Abou-Kandil et al. | 438/93 |

OTHER PUBLICATIONS

Hazra et al., "Role of deposition parameters on the photovoltaic qualityof amorphous silicon germanium alloys: correlation of microstructure with defect density and electronic transport", J. Phys. D: Appl. Phys. vol. 34 (2001), pp. 2475-2481.*

Ballutaud, J., et al. "Reduction of the Boron Cross-Contamination for Plasma Deposition of P-I-N. Devices in a Single-Chamber Large Area Radio-Frequency Reactor" Thin Solid Films, vol. 468, Issues 1-2. Dec. 2004. pp. 222-225.

U.S. Appl. No. 12/968,490. "Photovoltaic Devices With an Interfacial Germanium—Containing Layer and Methods for Forming the Same," filed Dec. 15, 2010. (31 pages).

Landweer, G. "Photoemission Measurements on Aluminium and Amorphous Silicon by Pulsed Laser Illumination in Presence of a Plasma," Laboratoire de Physique des Interfaces et des Couches Minces, Aug. 12, 1996. (pp. 579-583).

Yang, Li. "Tricolor Microcavity OLEDs Based on P-nc-Si:H Films as the Complex Anodes," Journal of Semiconductors, Jun. 2009. vol. 30, No. 6. (6 pages).

* cited by examiner

ENHANCING EFFICIENCY IN SOLAR CELLS BY ADJUSTING DEPOSITION POWER

RELATED APPLICATION INFORMATION

This application is related to commonly assigned application Ser. No. 13/407,006, filed on Feb. 28, 2012 and incorporated herein by reference.

This application is a Continuation application of co-pending U.S. patent application Ser. No. 13/406,970 filed on Feb. 28, 2012, incorporated herein by reference in its entirety.

BACKGROUND

1. Technical Field

The present invention relates to photovoltaic devices and methods for fabrication, and more particularly to devices, structures and fabrication methods that improve efficiency by adjustment of deposition power of a buffer layer and/or a p+ layer.

2. Description of the Related Art

A barrier height is a difference between work functions of different materials. The barrier height is affected by the type of material with which the semiconductor is in contact. A band offset is the measure of misalignment between energy levels at the interface between two solids. The offset between an electrode and a semiconductor is called a "Schottky barrier". The barrier height and offset are measures of how much a given material resists the flow of electrical charge through a medium. Both semiconductor-semiconductor band offset and semiconductor-electrode Schottky barrier decrease solar cell efficiency.

SUMMARY

Methods for forming a photovoltaic device include adjusting a deposition power for depositing a buffer layer including germanium on a transparent electrode. The deposition power is configured to improve device efficiency. A p-type layer is formed on the buffer layer. An intrinsic layer and an n-type layer are formed over the p-type layer.

Another method for forming a photovoltaic device includes forming a transparent electrode on a transparent substrate, the transparent electrode having a first Fermi level; adjusting a deposition power for depositing a buffer layer including germanium on the transparent electrode, the deposition power being configured to improve device efficiency, the buffer layer having a Fermi level aligned with the first Fermi level; depositing a p-type layer on the buffer layer, the p-type layer having a conduction band level aligned with a conduction band level of the buffer layer; forming an intrinsic layer on the p-type layer; and forming an n-type layer on the intrinsic layer.

Yet another method for forming a photovoltaic device includes forming a transparent electrode on a transparent substrate, the transparent electrode having a first Fermi level; depositing a buffer layer including germanium on the transparent electrode, the buffer layer having a Fermi level substantially aligned with the first Fermi level; adjusting a deposition power for forming a p-type layer on the buffer layer, the deposition power being configured to improve device efficiency, the p-type layer having a conduction band level aligned with a conduction band level of the buffer layer; forming an intrinsic layer on the p-type layer; and forming an n-type layer on the intrinsic layer.

Still another method for forming a photovoltaic device includes forming a transparent conductive oxide on a transparent substrate; adjusting a first deposition power for depositing a buffer layer including germanium on the transparent electrode, the first deposition power being configured to improve device efficiency; adjusting a second deposition power for depositing a p-type amorphous layer on the buffer layer such that the second deposition power is configured to improve device efficiency; forming an amorphous silicon intrinsic layer on the p-type layer; forming an amorphous silicon n-type layer on the intrinsic layer; and forming a back reflector on the n-type layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, methods and devices are presented that provide improved efficiency based upon deposition parameters of a buffer layer formed between layers of a photovoltaic device. A band offset at a p-i interface and/or at a transparent conductive oxide (TCO) to p+ interface is adjusted to provide improved solar devices.

Band offset at the TCO/p+ layer is unavoidable since all developed TCO films are n-type. In particularly useful embodiments, photovoltaic devices are constructed using materials and processes that adjust deposition power for the formation of a buffer layer at the TCO/p+ interface. In one example, a device is provided which has a minimized band offset at a p-doped layer to intrinsic layer (p-i) interface. In another example, a buffer layer is deposited between the TCO and the $p^+$ layer of the device using a deposition process designed to improve device efficiency. To provide improved efficiency, the manner in which the buffer layer is formed is addressed in accordance with the present principles.

Methods and devices provide a deposition process and power settings that improve device efficiency. In one embodiment, the buffer layer includes Ge and is disposed between the TCO layer and the p+ layer of the solar cell. The Ge is deposited using power deposition settings that are adjusted to reduce band offsets between materials. The Ge is preferably deposited using a high power deposition process to affect the properties of the buffer layer to increase efficiency of the device. In another embodiment, the p+ layer or p-type layer is deposited or processed to reduce band offsets. This may be performed in addition to or instead of the buffer layer processing.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit or board may be embodied in a graphical computer programming language, and stored in a computer storage medium (such as a disk, tape, physical hard drive, or virtual hard drive such as in a storage access network). If the designer does not fabricate chips or photovoltaic devices, the designer may transmit the resulting design by physical means (e.g., by providing a copy of the storage medium storing the design) or electronically (e.g., through the Internet), directly or indirectly.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor.

It should be further understood that material compounds will be described in terms of listed elements, e.g., SiC, SiGe, etc. These compounds include different proportions of the elements within the compound, e.g., $Si_xC_y$ where $x/y \neq 1$, etc. In addition, other elements may be included in the compound and still function in accordance with the present principles.

Figure 1:
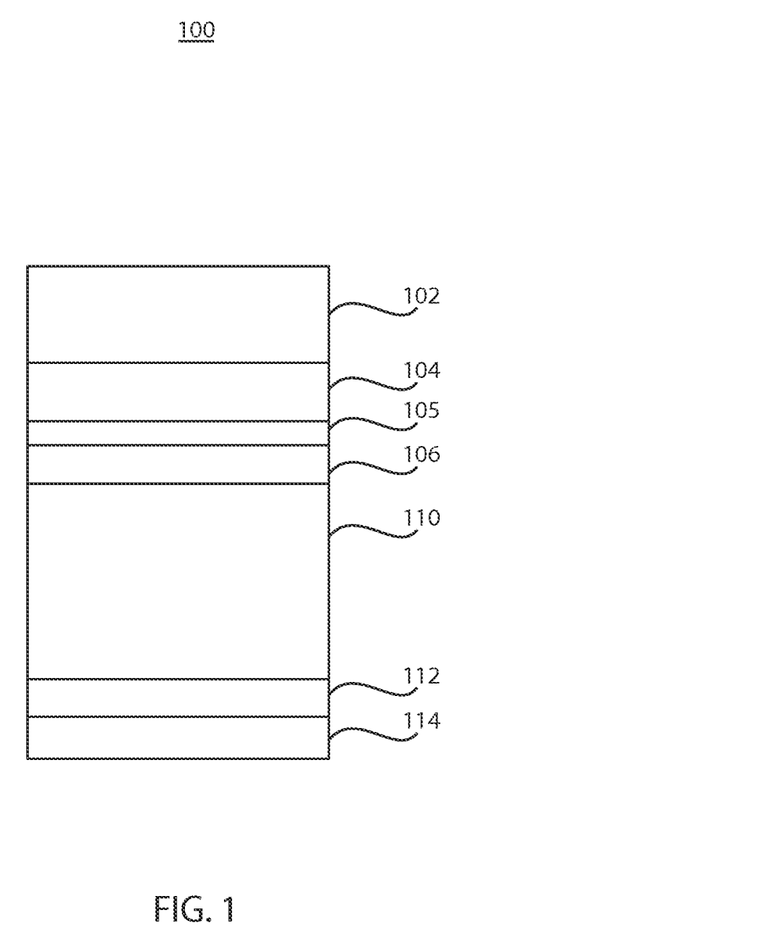
FIG. 1 is a cross-sectional view of a photovoltaic device with a buffer layer formed in accordance with the present principles.

Referring now to the drawings in which like numerals represent the same or similar elements and initially to FIG. 1, an illustrative photovoltaic structure 100 is illustratively depicted in accordance with one embodiment. The photovoltaic structure 100 may be employed in solar cells, light sensors or other photovoltaic applications. Structure 100 includes a substrate 102 that permits a high transmittance of light. The substrate 102 may include a transparent material, such as glass, a polymer, etc. or combinations thereof.

A first electrode 104 includes a transparent conductive material. Electrode 104 may include a transparent conductive oxide (TCO), such as, e.g., a fluorine-doped tin oxide ($SnO_2$: F, or "FTO"), doped zinc oxide (e.g., ZnO:Al), indium tin oxide (ITO) or other suitable materials. For the present example, a doped zinc oxide is illustratively employed for electrode 104. The TCO 104 permits light to pass through to an active light-absorbing material beneath and allows conduction to transport photo-generated charge carriers away from that light-absorbing material. The TCO 104 may be deposited by a chemical vapor deposition (CVD) process, a low pressure CVD (LPCVD) process or a plasma-enhanced (PE-CVD) process.

A buffer layer 105 may include germanium or silicon germanium and may include a p-type dopant such as B, Ga, In or combinations thereof. In one embodiment, the buffer layer 105 includes a silicon-germanium alloy layer including germanium, silicon, optionally a p-type dopant, and hydrogen. In this embodiment, the atomic concentration of germanium may be greater than 50%. Depending on the work-function of TCO 104, Si content in Ge can be varied. The buffer layer 105 has a greater atomic concentration of germanium than a p-doped layer 106 formed on the buffer layer 105.

The buffer layer 105 can be amorphous, microcrystalline, or single crystalline. The buffer layer 105 may include a hydrogenated material. For example, if the buffer layer 105 includes a hydrogenated amorphous silicon germanium alloy, a hydrogenated microcrystalline silicon-germanium alloy, a hydrogenated amorphous germanium, or a hydrogenated microcrystalline germanium, the hydrogenation of the material of the buffer layer 105 decreases localized electronic states and increases the conductivity of the buffer layer 105. A hydrogenated amorphous germanium may be formed using $GeH_4$ plasma.

The buffer layer 105 can be formed, for example, by a chemical vapor deposition (CVD) process or plasma enhanced chemical vapor deposition (PECVD). The thickness of the buffer layer 105 can be from about 1 nm to about 20 nm, although lesser and greater thicknesses can also be employed.

The buffer layer 105 provides an interfacial layer that better aligns the Fermi level of the TCO layer 104 (e.g., ZnO) with that of a p-type layer 106 (e.g., a-SiC:H). The Fermi level of the TCO layer 104 in the case of ZnO is about 4.5 eV. Without the buffer layer 105, a larger Schottky barrier exists between the TCO 104 and the p-type layer 106. With the buffer layer 105, the Fermi levels of TCO 104 and the buffer layer 105 are well-aligned reducing the barrier offset. A conduction band between the buffer layer 105 and the p-type layer 106 are also well-aligned. In this way, the Schottky barrier is reduced or eliminated resulting in better conduction and more efficient device operation by permitting higher open circuit voltage ($V_{OC}$) without sacrificing fill factor (FF).

In accordance with the present principles, the present inventors have discovered that the manner in which the buffer layer 105 is formed also can contribute to improvements in device efficiency for photovoltaic devices formed with the buffer layer 105. In particularly useful embodiments, it is believed that increased crystallinity of the buffer layer 105 correlates with increased $V_{OC}$ while at least maintaining FF.

The p-doped layer 106 includes an amorphous, microcrystalline, or single-crystalline p-doped silicon-containing material. The p-doped layer 106 can be a p-doped silicon layer including silicon and at least one p-type dopant and optionally hydrogen; a p-doped silicon-germanium alloy layer including silicon, germanium, at least one p-type dopant and optionally hydrogen; a p-doped silicon-carbon alloy layer including silicon, carbon, at least one p-type dopant and optionally hydrogen; or a p-doped silicon-germanium-carbon alloy layer including silicon, germanium, carbon, at least one p-type dopant and optionally hydrogen. Other materials may also be employed.

In some cases, the p-doped layer 106 may include a hydrogenated amorphous, microcrystalline, or single-crystalline p-doped silicon-containing material. The presence of hydrogen in the p-doped layer 106 can increase the concentration of free charge carriers, i.e., holes, by delocalizing the electrical charges that are pinned to defect sites. A hydrogenated p-doped silicon-containing material can be deposited in a process chamber having a silicon-containing reactant gas as a carrier gas. To facilitate incorporation of hydrogen in the hydrogenated p-doped silicon-containing material, a carrier gas including hydrogen can be employed. Hydrogen atoms in the hydrogen gas within the carrier gas are incorporated into the deposited material to form an amorphous or microcrystalline hydrogenated p-doped silicon-containing material of the p-doped layer 106.

In one embodiment, p-doped or p-type layer 106 includes boron as a dopant, although other p-type dopants may be employed. Layer 106 may be deposited using diborane gas, trimethylborane or other gases. The p-type layer 106 may have a thickness of between about 5-20 nm. In particularly useful embodiments, layer 106 includes amorphous SiC or Si. The processing of the p-type layer 106 also can affect the efficiency of the device. For example, the deposition parameters for depositing the p-type layer 106 may be selected to increase the effects of the buffer layer 105.

Processing continues with the formation of an intrinsic layer 110 formed on layer 106 from compatible materials. Intrinsic layer 110 may be undoped and may include an amorphous silicon material, e.g., hydrogenated amorphous Si (a-Si:H) or a hydrogenated amorphous silicon carbide (a-SiC:H). The intrinsic layer 110 may include a thickness of between about 100-300 nm, although other thicknesses are contemplated. The intrinsic layer 110 may be formed using a chemical vapor deposition (CVD) process, or a plasma-enhanced (PE-CVD), e.g., from silane gas and hydrogen gas.

A doped layer 112 (e.g., an n-type layer) is formed on the intrinsic layer 110. Layer 112 may include an n-type Si containing layer, e.g., hydrogenated microcrystalline (μc-Si:H), single crystalline (Si) or an amorphous (a-Si) layer. Layer 112 may be deposited by a chemical vapor deposition (CVD) process, or a plasma-enhanced (PE-CVD). The n-type layer 112 may have a thickness of between about 5-20 nm. A back reflector and/or bottom electrode 114 may be formed using a reflective metal, such as Ag, Al, Au, etc. A suitable metal deposition process may be employed, e.g., physical or chemical vapor deposition, sputtering, electro or electroless plating, etc. It should be understood that other material selections, layers, structures, etc. may be employed in device 100 including additional back reflectors or instead of back reflectors, tandem cells, etc.

Figure 2:
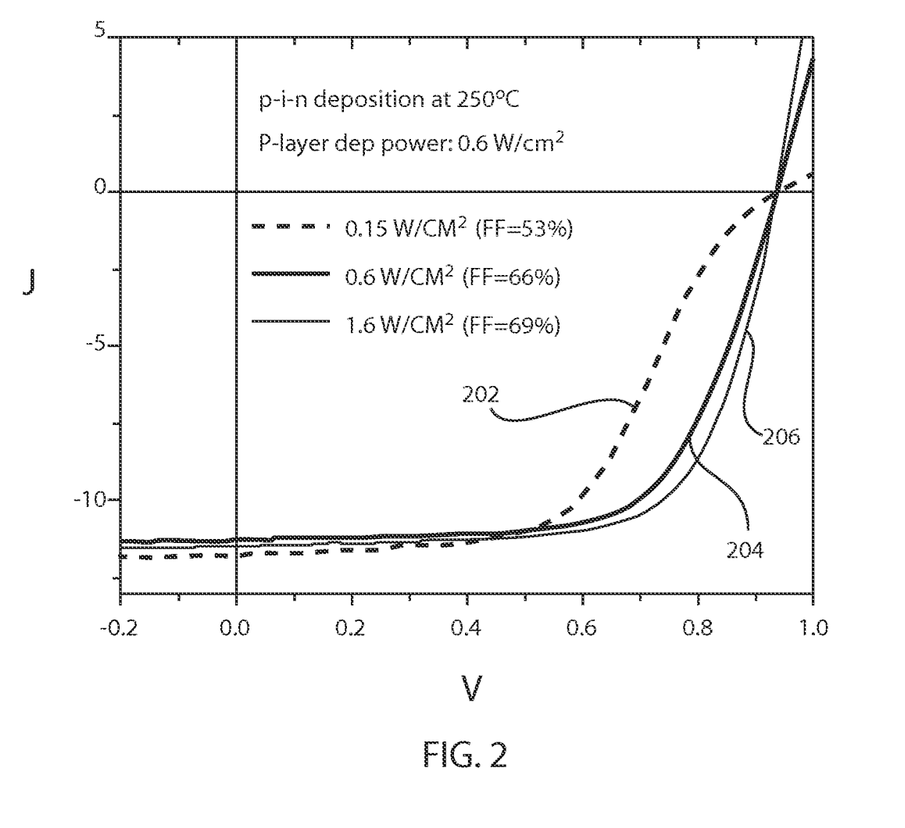
FIG. 2 depicts a graph showing current density ($mA/cm^2$) versus voltage (V) for three different deposition powers for forming a buffer layer to demonstrate an effect of deposition power on the buffer layer in accordance with the present principles.

Referring to FIG. 2, a graph showing an effect for deposition power of the buffer layer 105 is illustratively shown. The graph shows three plots corresponding to different deposition powers for a-GeSi:H. The graph plots current density (J) in mA/cm$^2$ versus voltage (V) in volts for three devices. The deposition powers include the following 0.15 W/cm$^2$ for plot 202, 0.6 W/cm$^2$ for plot 204 and 1.6 W/cm$^2$ for plot 206. A systematic degradation of FF occurs as the deposition power is reduced. For a power of 0.15 W/cm$^2$ (plot 202), FF was 53%. For a power of 0.6 W/cm$^2$ (plot 204), FF was 66%. For a power of 1.6 W/cm$^2$ (plot 206), FF was 69%. Advantageously, $V_{OC}$ remains high with higher FF.

The plots 202, 204 and 206 correspond to devices that were processed in the same way but for the deposition power of the buffer layer. The devices included p-i-n (p-type, intrinsic, n-type) layers deposited at 250 degrees C. and the p type layer (106) was deposited with a power of 0.6 W/cm$^2$ for these devices.

Figure 3:
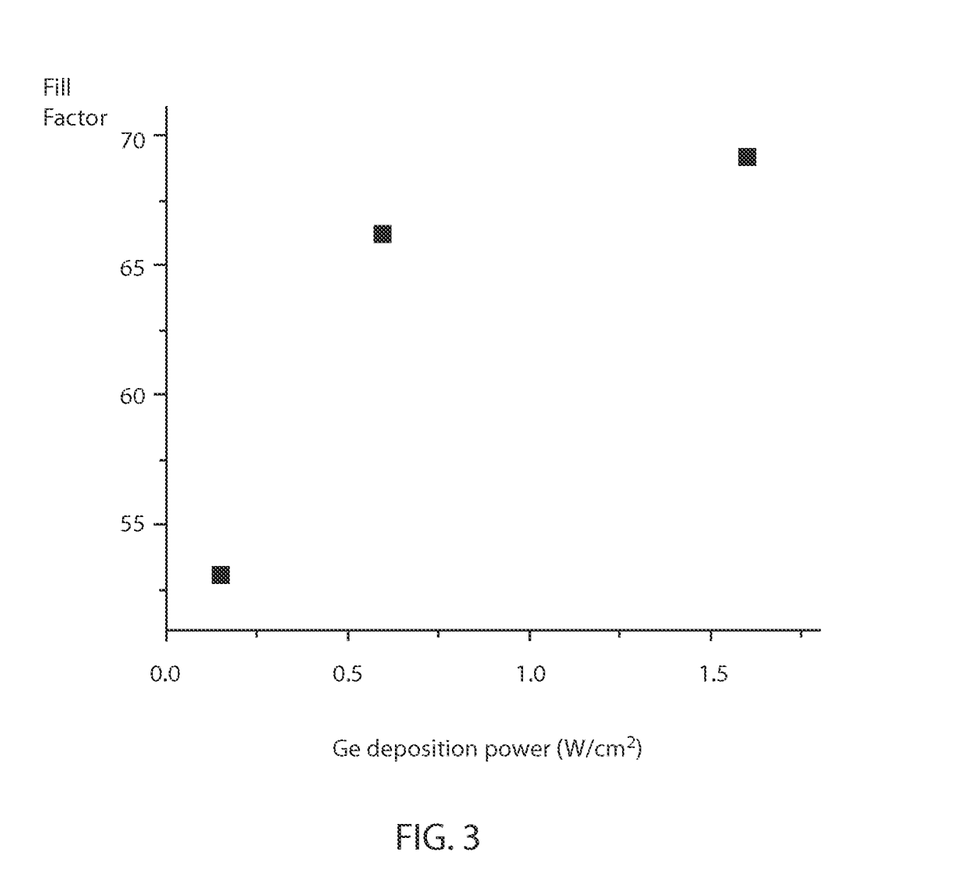
FIG. 3 depicts a graph showing fill factor (%) variation as a function of Ge deposition power ($W/cm^2$) for three different deposition powers in accordance with the present principles.

Referring to FIG. 3, experimental results for devices fabricated using different deposition powers are depicted. Fill factor (%) is graphed versus Ge deposition power (W/cm$^2$) for the devices of FIG. 2. In accordance with the graph, FF increased with deposition power. It should be understood that the deposition power may be increased to levels higher than those depicted herein (e.g., deposition powers of 200 W/cm$^2$ or greater may be provided) and that comparable improvements may be obtained but may have some limitations. In addition, other parameters may be adjusted as well including duration of a treatment, temperature, etc.

Figure 4:
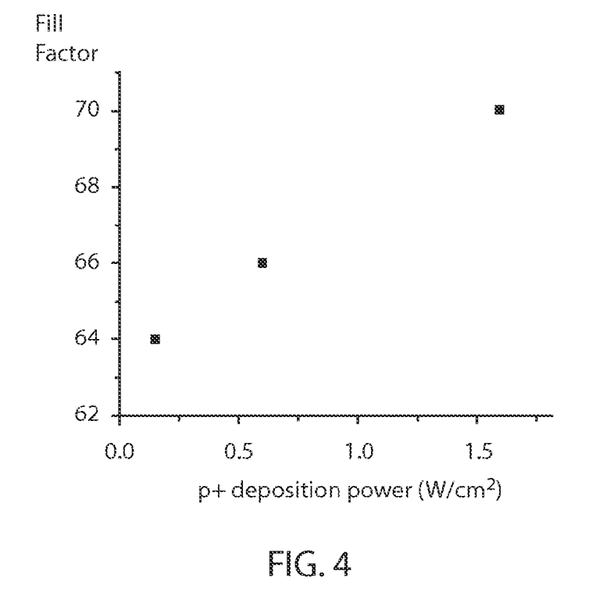
FIG. 4 depicts a graph showing fill factor (%) variation as a function of p-type layer deposition power ($W/cm^2$) for three different deposition powers in accordance with the present principles.

Referring to FIG. 4, while the manner in which the buffer layer 105 is formed contributes to improvements in device efficiency for photovoltaic devices, the manner in which layers in contact with the buffer layer (105) are formed also contribute to improvements in device efficiency. FIG. 4 shows fill factor (FF) (%) versus p+ deposition power (W/cm$^2$). The p+ deposition includes the formation of the p-type layer (106) on the buffer layer (105). The greater the deposition power, the greater the FF becomes. For the data collected in FIG. 4, the Ge buffer layer was formed at 0.6 W/cm$^2$ for all three samples. It should be understood that the deposition power may be increased to levels higher than those depicted herein.

Figure 5:
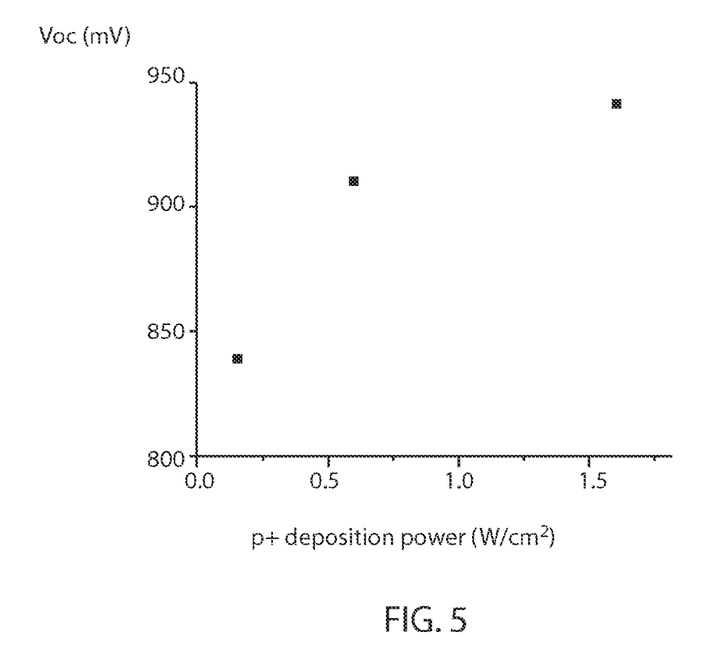
FIG. 5 depicts a graph showing open circuit voltage ($V_{OC}$) variation as a function of p-type layer deposition power ($W/cm^2$) for three different deposition powers in accordance with the present principles.

Referring to FIG. 5, $V_{OC}$ (mV) versus p+ deposition power (W/cm$^2$) is plotted. The p+ deposition includes the formation of the p-type layer (106) on the buffer layer (105) as described above. The greater the deposition power in the range depicted, the greater the $V_{OC}$ becomes. For the data collected in FIG. 5, the Ge buffer layer was also formed at 0.6 W/cm$^2$ for all three samples.

Figure 6:
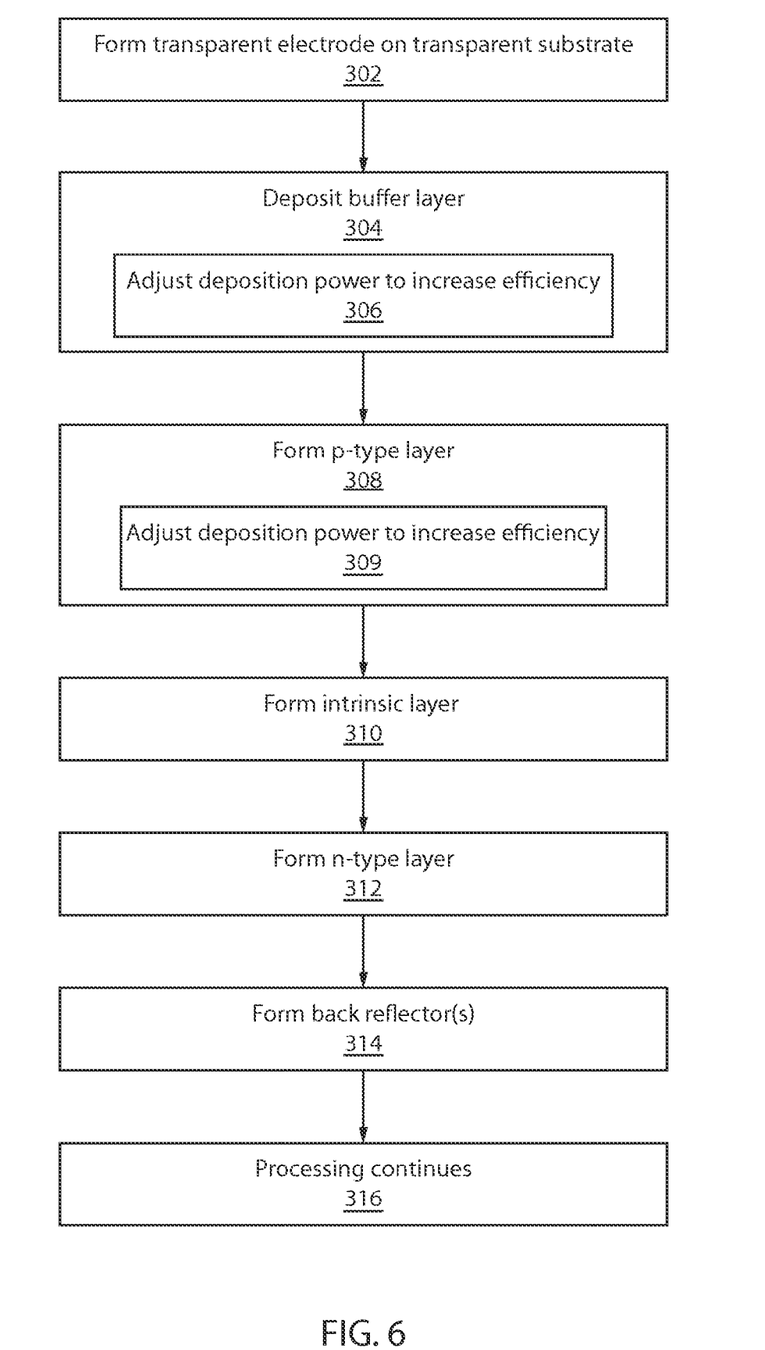
FIG. 6 is a block/flow diagram showing methods for fabricating a photovoltaic device using a buffer layer in accordance with illustrative embodiments.

Referring to FIG. 6, methods for forming a photovoltaic device are illustratively shown. It should also be noted that, in some alternative implementations, the functions noted in the blocks may occur out of the order noted in FIG. 6. For example, two blocks shown in succession may, in fact, be executed substantially concurrently, or the blocks may sometimes be executed in the reverse order, depending upon the functionality involved. It will also be noted that each block of the block diagram and/or flowchart illustration, and combinations of blocks in the block diagram and/or flowchart illustration, can be implemented by special purpose hardware-based systems that perform the specified functions or acts, or combinations of special purpose hardware and computer instructions.

In block 302, a transparent electrode is formed on a transparent substrate. The transparent electrode may include a transparent conductive oxide or the like. The transparent electrode has a first Fermi level. In block 304, a buffer layer including germanium is deposited on the transparent electrode. The buffer layer may include at least one of a hydrogenated amorphous silicon germanium alloy, a hydrogenated microcrystalline silicon-germanium alloy, a hydrogenated amorphous germanium or a hydrogenated microcrystalline germanium. The buffer layer is preferably deposited by a plasma enhanced chemical vapor deposition process, although other processes may be employed. In one embodiment, the buffer layer may be formed by a GeH$_4$ plasma enhanced deposition.

In block 306, a deposition power for depositing a buffer layer on transparent electrode is adjusted. The buffer layer deposition power may be adjusted to obtain a desired FF or overall device efficiency. In one useful embodiment, the deposition power is increased to a deposition power configured to improve device efficiency. The deposition power is increased to increase fill factor, and V$_{OC}$ is maintained at a high level (e.g., upper 900's mV or greater). The deposition power may be increased before the deposition process is initiated or may be ramped up during the deposition process to provide a graduated buffer layer. The buffer layer includes a Fermi level aligned with the first Fermi level of the transparent electrode.

In block 308, a p-type layer is deposited or formed on the buffer layer. The buffer layer bridges or aligns band gap energies between the transparent electrode and the p-type layer. The p-type layer has a conduction band level aligned with a conduction band level of the buffer layer. This better transitions the differential between energy barriers of the transparent electrode and the p-type layer. In block 309, a deposition power for the p-type layer may also be adjusted (increased) to improve device efficiency. It should be noted that the adjustment steps in blocks 306 and 309 may be performed together on a same device, or may be performed without the other adjustment step on the same device. For example, the efficiency of a device may be improved by adjusting the deposition power of the buffer layer, adjusting the deposition power of the p-type layer or both.

In block 310, an intrinsic layer is formed on the p-type layer. In block 312, an n-type layer is formed on the intrinsic layer. The p-type layer, the intrinsic layer and the n-type layer may be formed at a temperature of about 250 degrees Celsius. Other temperatures may also be employed.

In block 314, a back reflector or back reflectors may be formed. In one embodiment, the p-type layer includes a form of silicon (e.g., a-Si, a-Si:H, a-SiC, a-SiC:H, crystalline forms of Si or SiC, etc.). The intrinsic layer may include a-Si, a-Si:H, or crystalline forms of Si, etc.). The n-type layer may include an n-doped form of a-Si, a-Si:H, or crystalline forms of Si, etc.). In block 316, processing continues to complete the photovoltaic device.

Having described preferred embodiments for enhancing efficiency in solar cells by adjusting deposition power (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
   adjusting a deposition power for depositing a buffer layer including germanium on a transparent electrode, the deposition power being configured to improve device efficiency, wherein the buffer layer aligns band gap energies between the transparent electrode and a subsequently formed p-type layer by ramping the deposition power at least during deposition of the buffer layer;
   forming the p-type layer on the buffer layer; and
   forming an intrinsic layer and an n-type layer over the p-type layer.

2. The method as recited in claim 1, wherein depositing the buffer layer includes depositing at least one of a hydrogenated amorphous silicon germanium alloy, a hydrogenated microcrystalline silicon-germanium alloy, a hydrogenated amorphous germanium or a hydrogenated microcrystalline germanium.

3. The method as recited in claim 1, wherein the deposition power is increased to increase fill factor.

4. The method as recited in claim 1, wherein the buffer layer is formed by a GeH$_4$ plasma enhanced deposition.

5. The method as recited in claim 1, wherein the p-type layer, the intrinsic layer and the n-type layer are formed at a temperature of about 250 degrees Celsius.

6. The method as recited in claim 1, further comprising adjusting a deposition power for the p-type layer to improve device efficiency.

7. The method as recited in claim 1, wherein the p-type layer includes a form of silicon.

8. The method as recited in claim 7, wherein the p-type layer includes at least one of amorphous silicon, amorphous silicon carbide, hydrogenated amorphous silicon, or hydrogenated amorphous silicon carbide.

9. A method for forming a photovoltaic device, comprising:
   adjusting a deposition power for depositing a buffer layer including germanium on a transparent electrode, the deposition power being configured to improve device efficiency, wherein the adjusting of the deposition power for depositing the buffer layer to improve device efficiency occurs by ramping the deposition power at least during deposition of the buffer layer;
   forming the p-type layer on the buffer layer; and
   forming an intrinsic layer and an n-type layer over the p-type layer.

10. The method as recited in claim 9, wherein depositing the buffer layer includes depositing at least one of a hydrogenated amorphous silicon germanium alloy, a hydrogenated microcrystalline silicon-germanium alloy, a hydrogenated amorphous germanium or a hydrogenated microcrystalline germanium.

11. The method as recited in claim 9, wherein the deposition power is increased to increase fill factor.

12. The method as recited in claim 9, wherein the buffer layer is formed by a GeH$_4$ plasma enhanced deposition.

13. The method as recited in claim 9, wherein the p-type layer, the intrinsic layer and the n-type layer are formed at a temperature of about 250 degrees Celsius.

14. The method as recited in claim 9, further comprising adjusting a deposition power for the p-type layer to improve device efficiency.

15. The method as recited in claim 9, wherein the p-type layer includes a form of silicon.

16. The method as recited in claim 7, wherein the p-type layer includes at least one of amorphous silicon, amorphous silicon carbide, hydrogenated amorphous silicon, or hydrogenated amorphous silicon carbide.

* * * * *